United States Patent
Boy et al.

(10) Patent No.: US 12,313,578 B2
(45) Date of Patent: May 27, 2025

(54) METHOD FOR PRODUCING SEMICONDUCTOR WAFERS

(71) Applicant: SILTRONIC AG, Munich (DE)

(72) Inventors: Michael Boy, Waging am See (DE); Ludwig Koester, Burghausen (DE); Elena Soyka, Emmerting (DE); Peter Storck, Burghausen (DE)

(73) Assignee: Siltronic AG, Munich (DE)

( * ) Notice: Subject to any disclaimer, the term of this patent is extended or adjusted under 35 U.S.C. 154(b) by 652 days.

(21) Appl. No.: 17/612,603

(22) PCT Filed: Apr. 30, 2020

(86) PCT No.: PCT/EP2020/061992
§ 371 (c)(1),
(2) Date: Nov. 19, 2021

(87) PCT Pub. No.: WO2020/233960
PCT Pub. Date: Nov. 26, 2020

(65) Prior Publication Data
US 2022/0236205 A1    Jul. 28, 2022

(30) Foreign Application Priority Data
May 21, 2019   (DE) ............ 10 2019 207 433.2

(51) Int. Cl.
*G01N 25/72* (2006.01)
*C30B 29/06* (2006.01)
*C30B 33/02* (2006.01)
*H01L 21/66* (2006.01)
*C30B 13/00* (2006.01)
*C30B 15/00* (2006.01)

(52) U.S. Cl.
CPC ............. *G01N 25/72* (2013.01); *C30B 29/06* (2013.01); *C30B 33/02* (2013.01); *H01L 22/12* (2013.01); *C30B 13/00* (2013.01); *C30B 15/00* (2013.01)

(58) Field of Classification Search
None
See application file for complete search history.

(56) References Cited

U.S. PATENT DOCUMENTS

| | | | |
|---|---|---|---|
| 2004/0040632 A1 | 3/2004 | Oosterlaken | |
| 2006/0213424 A1* | 9/2006 | Mueller | ........ C30B 31/14 117/15 |
| 2008/0311342 A1 | 12/2008 | Muller et al. | |
| 2010/0003811 A1 | 1/2010 | Wada | |
| 2012/0098100 A1 | 4/2012 | Daub et al. | |
| 2017/0234960 A1* | 8/2017 | Rapoport | ........ H01L 21/266 257/607 |

FOREIGN PATENT DOCUMENTS

| | | |
|---|---|---|
| CN | 200710153795 A | 5/2008 |
| CN | 102664160 A | 9/2012 |
| JP | 201016312 A | 1/2010 |
| JP | 201573049 A | 4/2015 |

OTHER PUBLICATIONS

H.D. Geiler et al., "Photoelastic stress evaluation and defect monitoring in 300-mm-wafer manufacturing," Materials Science in Semiconductor Processing 5 (2003) 445-455.
M.V. Mezhennyi, "Simulation of the Stresses Produced in Large-Diameter Silicon Wafers during Thermal Annealing," Physics of the Solid Sate, vol. 45, No. 10, 2003, pp. 1884-1889.

* cited by examiner

Primary Examiner — Erica S Lin
(74) Attorney, Agent, or Firm — BROOKS KUSHMAN P.C.

(57) ABSTRACT

Suitability of silicon wafers for use in device processing without generation of fatal defects is assessed by using SIRD to measure stress in a wafer cut from a piece of a crystal ingot after first and second thermal treatments of the water, the second thermal treatment consisting of a heating phase, a holding phase, and a cooling phase. The result is used to consider whether silicon wafers cut from the piece can adequately survive device processing without generating excess defects.

14 Claims, No Drawings

METHOD FOR PRODUCING SEMICONDUCTOR WAFERS

CROSS REFERENCE TO RELATED APPLICATIONS

This application is the U.S. National Phase of PCT Appln. No. PCT/EP2020/061992 filed Apr. 30, 2020, which claims priority to German Application No. 10 2019 207 433.2 filed May 21, 2019, the disclosures of which are incorporated in their entirety by reference herein.

BACKGROUND OF THE INVENTION

1. Field of the Invention

The present invention relates to a method for producing semiconductor wafers, more particularly to the testing of crystal pieces for suitability in component processing.

2. Description of the Related Art

Monocrystalline semiconductor wafers are the foundation of modern-day electronics. During the production of components on semiconductor wafers, thermal processes are carried out that are now decidedly complex. It is hardly surprising that these steps may lead to thermal stresses (called "stress" below) in the crystal lattice. Even an unfavorable mounting of the semiconductor wafers during the thermal treatment on the wafer support thereof may lead to additional stress, and ultimately, alongside other factors, the coating of the semiconductor wafers also may give rise to additional stress fields.

The physical parameter known as upper yield stress, $\tau_{uy}$, is that parameter of the semiconductor wafer that indicates the stress level above which the deformation of the semiconductor wafer is no longer elastically reversible, but instead becomes plastically irreversible. The upper yield stress of the individual semiconductor wafer is dependent on numerous parameters, knowledge of/access to which for the particular case is absent or incomplete.

If the induced stress is greater than the respective upper yield stress, dissipation of the stress through irreversible deformation may take place by mechanisms including the formation of slip lines, which during component processing may lead to failures and hence to increased costs on the part of the device process.

Monocrystalline semiconductor wafers, especially those made of silicon, are typically produced by first pulling a monocrystalline rod by means of the float zone method (FZ) or the Czochralski method (CZ). The rods produced accordingly are divided into crystal pieces, which are processed to semiconductor wafers typically in a wire saw or internal diameter saw. After grinding, polishing, and edge machining, an epitaxial layer may optionally be applied by CVD. These semiconductor wafers thus produced are thereafter made available to further device processing.

If the slip in the semiconductor wafer is recognized only on the thermal treatment of the semiconductor wafer in device processing, the costs arising may be considerable, according to the particular vertical range of manufacture.

For this reason, there is a need for the semiconductor wafers input into device processing to comprise only those wafers for which the stress occurring in device processing is less than the upper yield stress, and for which, therefore, no slip lines are formed with the consequent defects.

In practice there is sufficient knowledge neither of the upper yield stress of the particular semiconductor wafer nor of the stress arising during device processing.

It is possible in principle to reduce the stress arising in the semiconductor wafer during a thermal step. For example, US 2007/084827 A1 teaches that a susceptor having a particularly low surface roughness, on which the semiconductor wafer rests while being thermally treated, is capable of reducing the number of slip lines occurring. However, this measure does not enable a reduction in thermally induced stress caused, for example, by very high heating and cooling rates. High heating and cooling rates are typically used in practice, since high throughputs limit the available time.

US 2004/040632 A1 describes a special susceptor which provides a planar support surface for semiconductor wafers to be treated at high temperatures. This susceptor appears to be capable of reducing mechanically induced stresses of the semiconductor wafers during the treatment. Here again there is no reduction of thermally induced stresses.

Both the upper yield stress of a semiconductor wafer and the semiconductor wafer stress actually induced in device processing are very difficult to predict. Consequently, it is also very difficult to predict whether a semiconductor wafer will suffer damage or not in device processing.

A first object of the present invention, therefore, is to create a method for evaluating semiconductor material of a semiconductor wafer that is able to provide an indication as to whether the semiconductor wafers manufactured will or will not suffer damage in device processing because of damage due to generation of stress.

A second object of the present invention is to create a method for evaluating a semiconductor wafer that is able to determine the magnitude and the direction of a residual stress in a wafer.

SUMMARY OF THE INVENTION

The foregoing objects and others are met by a method for producing semiconductor wafers, wherein a single-crystal rod of silicon is provided, the rod is cut into ingot segments, and a test wafer is cut from an ingot segment. The test wafer is optionally subjected to a first thermal treatment and thereafter, a second and required thermal treatment takes place, this second thermal treatment comprising a heating phase, a holding phase at holding temperature $T_h$, and a cooling phase, and which causes a radial temperature gradient DT on the test wafer, followed by analysis of the wafer of semiconductor material with respect to stress fields, and the further-processing of the semiconductor wafers cut from the crystal piece in accordance with further-processing steps which are selected in dependence on the result of the analysis of the test wafer.

DETAILED DESCRIPTION OF THE PREFERRED EMBODIMENTS

Preferred embodiments of the method of the invention are described in detail in the following description. The individual features may be realized either separately or in combination as embodiments of the invention.

The invention starts from a single crystal of silicon (rod, ingot), pulled according to the prior art, which first of all is cut into crystal pieces by means of a saw, preferably a band saw.

For the invention, the single crystal may also consist of another semiconductor material such as, for example, germanium, gallium arsenide, gallium nitride, or mixtures thereof. For the invention, furthermore, there are other crystal growing methods that can be used besides the Czochralski crystal pulling method, an example being float zone (FZ) growth.

Preferably at least one semiconductor wafer is cut as a test wafer from one crystal piece, using a band saw or internal diameter saw, and is supplied for analysis in accordance with the invention. The rest of the crystal piece in question is supplied to the further manufacturing process for semiconductor wafers, according to the result of the analysis.

The further production process for semiconductor wafers comprises the steps of wire sawing, grinding, lapping, polishing, edge rounding, cleaning, and etching. The application of a layer of further semiconductor material, deposited homo- or heteroepitaxially, is optional.

The semiconductor wafers of semiconductor material separated from a single crystal preferably comprise monocrystalline silicon wafers having a diameter of 150 mm, 200 mm or, preferably, 300 mm.

A semiconductor wafer comprises a front side and a back side and also a circumferential edge, which together form the surface of this wafer. The edge consists in general of two surfaces flattened by prior grinding and etching processes, called the "facets," and of a circumferential surface perpendicular to the front/back side of the wafer, called the apex or blunt. The front side of the wafer of semiconductor material is by definition the side on which in subsequent component processing the desired microstructures are applied.

The semiconductor wafer thus harvested is subjected in accordance with the invention preferably to a first thermal treatment, with the thermal budget of this thermal treatment corresponding preferably to the thermal treatment in the device processing. Whether this first step is carried out is irrelevant for the invention. The inventors, though, have recognized that carrying out this step significantly improves the measurement results.

In device processing, thermal treatment steps are typically carried out in order, for example, to apply coatings. The thermal conditions required, such as temperature and time (thermal budget) and the gas compositions required (ambient), vary according to the type of coating. It has emerged that whether a layer is or is not deposited during the thermal treatment is irrelevant for the method of the invention. Apparently it is enough to simulate the essential relevant time/temperature profile (thermal budget) of the device processing.

Device processing of this kind may be, for example, the test known as the Toshiba test (3 h at 780° C., then 16 h at 1000° C.). Other thermal steps, however, may also be used.

If the atmosphere used primarily in device processing is additionally used in the first thermal treatment step, which is preferably, the results of the method of the invention improve significantly again. The atmosphere in this case preferably comprises preferably one or more gases from the group of gases He, Ar, $H_2$, $O_2$, $N_2$, $NH_3$, $SiHCl_3$, $SiH_2Cl_2$, $SiH_4$, $SiCl_4$, $CH_4Cl_2Si$, $CH_4$ or $H_2O$.

The second thermal treatment process comprises a heating phase, a holding phase, and a cooling phase. The heating phase is the phase in which the semiconductor wafer is heated from room temperature to the desired temperature $T_h$ of the holding phase (holding temperature).

The heating rate is understood to be the ratio formed from the temperature difference between room temperature and temperature in the holding phase, and the heating time required to achieve it.

Furthermore, the cooling rate is understood to be the ratio formed from the temperature difference between the temperature in the holding phase and the room temperature, and the cooling time required to achieve it.

With particular preference a cooling rate of not more than 4 K/s is set. The preferred heating rate is preferably not more than 3 K/s.

In accordance with the invention the second thermal treatment process is carried out such that in the holding phase a temperature difference is induced on the semiconductor wafer. This temperature difference is understood here as a temperature gradient from the center to the edge of the semiconductor wafer, and the mean temperature of the semiconductor wafer is understood as the holding temperature.

Preference is given to setting a holding temperature of between 700° C. and 1410° C. (more preferably between 900° C. and 1100° C.). The holding time may vary between 10 seconds and 10 minutes; a preferred holding time is around 60 s.

More preferably the amount of the temperature gradient in the holding phase is between 1 and 30 K, very preferably between 2 and 5 K.

Very preferably the amount of the temperature gradient in the holding phase is both higher than in the heating phase and higher than in the cooling phase.

The skilled person is aware of a number of techniques for measuring the temperature gradient. For example, one or more pyrometers can be used for direct determination of the temperature difference at various locations on the hot wafer. With greater precision, however, the set temperature gradient can be determined indirectly, by coating a wafer with $SiHCl_3$, for example. This deposition is carried out in reaction-limited mode, and so the deposition rate is a strong function of the temperature. After measurement of the layer thickness of the layer deposited (by means of ellipsometry, for example) and the use of suitable calibration curves, it is possible to assign the temperature at each point of the wafer to one temperature and so to determine the radial temperature gradient.

Stress fields are local or else global stresses in the crystal lattice that are detectable by suitable methods, such as SIRD (Scanning Infrared Depolarization), for example. SIRD utilizes the physical principle whereby the direction of polarization of linearly polarized light is altered when it passes through a region, which is under mechanical stress. The depolarization in this case is defined as $$D = 1 - \frac{I_p - I_o}{I_p + I_o}$$

where $I_p$ is the intensity of the laser light captured in the detector and is polarized in accordance with the original direction of polarization (i.e., parallel). $I_o$ is the intensity of the laser light which is captured in the detector orthogonally to the original direction of polarization. The degree of depolarization D is taken here as a measure of the stress in the semiconductor wafer at the site of measurement.

The measuring technique used for measuring the stress in the test wafer is preferably SIRD.

The degree of depolarization is preferably measured preferably at positions of a predefined region of the semiconductor wafer, to give position-based measurement values. The position-based measurement values thus obtained are subjected to a high-pass filter having a cutoff wavelength of 2 mm.

The standard deviation 7 of these position-based measurement values is then calculated thus:

$$\bar{s} := \sqrt{\frac{1}{n}\sum_{i=1}^{n}(x_i - \bar{x})^2}$$

where n is the number of measurements, $x_i$ is the individual measurement value at position i, and $\bar{x}$ is the arithmetic mean of all the measurement values within the region.

In a first calculation method, preferably, a region is defined as a radially symmetric ring on the wafer whose midpoint coincides with the midpoint on the surface of the wafer. The external radius of the region here is less than the radius of the wafer, preferably less than 98% of the radius of the wafer, and the internal radius is greater than 50% of the radius of the wafer, preferably greater than 75% of the radius of the wafer.

The evaluated parameter $\bar{s}$ is understood here to be a first measure of the robustness of the wafer in relation to a thermal process step during device processing.

For example, with the application of the first calculating technique, it is possible to analyze ingot segments of different ingot segments from different crystal ingots, which differ in their production process. It is possible accordingly to carry out appropriate modification of parameters of crystal pulling in order to fulfil the stress robustness requirements of the semiconductor wafers.

In a second calculating technique, the measurement data processed using the high-pass filter are divided into at least two regions. Within the region, searching takes place according both to the maximum value and to the minimum value of the measurement value. If the maximum value is greater than a predefined discriminator value DU and the minimum value is smaller than the negative value of the discriminator value DU, then the region is designated as "poor", otherwise as "good".

In this second method, the proportion of the good regions in relation to all the regions is understood as a measure of the stress-susceptibility of the semiconductor wafer, for the quality of the wafer in respect of the thermal treatment.

With the application of the second calculating technique it is possible, for example, to identify and/or observe regions which are susceptible in terms of their stress-robustness.

What is claimed is:

1. A method for producing semiconductor wafers and grading the semiconductor wafers with respect to suitability for device processing, comprising:
   providing a single-crystal rod of silicon;
   cutting the rod into crystal pieces;
   removing a test wafer from a crystal piece;
   subjecting the test wafer to a first thermal treatment method and thereafter a second thermal treatment method,
   wherein the second thermal treatment method comprises a heating phase, a holding phase at a holding temperature $T_h$, and a cooling phase, and wherein during the holding phase, a radial temperature difference ΔT is established between a center and an edge on the test wafer;
   cooling the test wafer and analyzing the test wafer with respect to stress fields using an SIRD measurement after cooling; and
   utilizing the step of analyzing to decide whether semiconductor wafers obtained from a remainder of the crystal piece are to be used or not,
   wherein the duration of the holding phase is from 10 s to 10 min.

2. The method of claim 1, wherein the temperature of the holding phase $T_h$, is between 900° C. and 1100° C.

3. The method claim of claim 1, wherein the single-crystal rod is pulled by the Czochralski method.

4. The method of claim 1, wherein the single-crystal rod is pulled by the float zone method.

5. The method of claim 1, wherein the heating rate of the heating phase is less than 4 K/s and the cooling rate of the cooling phase is less than 5 K/s.

6. The method of claim 1, wherein the temperature difference between center and edge of the test wafer in the holding phase is between 1 K and 30 K.

7. The method of claim 1, wherein the temperature difference between center and edge of the test wafer in the holding phase is between 2 K and 5 K.

8. The method of claim 1, wherein the atmosphere of at least one thermal treatment step comprises at least one chemical substance selected from the group consisting of He, Ar, $H_2$, $O_2$, $N_2$, $NH_3$, $CH_4$, $SiHCl_3$, $SiH_2Cl_2$, $SiH_4$, $SiCl_4$, $CH_4Cl_2Si$, and $H_2O$.

9. The method of claim 1, wherein radial thermal gradients in both the heating phase and in the cooling phase are less than the radial thermal gradient in the holding phase.

10. The method of claim 1, wherein the second thermal treatment step takes place using a susceptor whereon the semiconductor wafer lies over the whole of its area.

11. The method of claim 1, wherein the temperature of the holding phase $T_h$, is between 700° C. and 1410° C.

12. A method for producing semiconductor wafers and grading the semiconductor wafers with respect to suitability for device processing, comprising:
    providing a single-crystal rod of silicon;
    cutting the rod into crystal pieces;
    removing a test wafer from a crystal piece;
    subjecting the test wafer to a first thermal treatment method and thereafter a second thermal treatment method,
    wherein the second thermal treatment method comprises a heating phase, a holding phase at a holding temperature $T_h$, and a cooling phase, and wherein during the holding phase, a radial temperature difference ΔT is established between a center and an edge on the test wafer;
    cooling the test wafer and analyzing the test wafer with respect to stress fields using an SIRD measurement after cooling; and
    utilizing the step of analyzing to decide whether semiconductor wafers obtained from a remainder of the crystal piece are to be used or not,
    wherein the first thermal treatment method comprises heating the wafer at 780° C. for 3 hours followed by heating at 1000° C. for 16 hours.

13. The method of claim 1, wherein the first thermal treatment method has a thermal budget suitable for depositing a homoepitaxial layer or a heteroepitaxial layer of semiconductor material.

14. The method of claim 1, wherein the first thermal treatment method simulates a thermal budget for device processing on the wafer.

* * * * *